United States Patent [19]

Lee

[11] Patent Number: 5,677,003
[45] Date of Patent: Oct. 14, 1997

[54] METHOD FOR COATING DIAMOND-LIKE CARBON ON HEAD DRUMS OF A VIDEO CASSETTE RECORDER

[75] Inventor: Tea-Young Lee, Seoul, Rep. of Korea

[73] Assignee: Sam Shin Precision, Co., Ltd., Rep. of Korea

[21] Appl. No.: 550,448

[22] Filed: Oct. 30, 1995

[51] Int. Cl.$^6$ .................... C23C 14/24; C23C 14/02
[52] U.S. Cl. .................. 427/249; 427/534; 427/560; 427/122; 427/255.7
[58] Field of Search .................. 427/249, 122, 427/255.7, 405, 534, 560, 129, 131; 360/136

[56] References Cited

U.S. PATENT DOCUMENTS 4,728,529 3/1988 Etzkorn et al. .................. 427/577
4,740,250 4/1988 Ahn et al. ........................ 148/2

FOREIGN PATENT DOCUMENTS 5-347021 12/1993 Japan.

OTHER PUBLICATIONS

Lee et al, "Application of diamond–like carbon films for anti–abrasion and low friction properties of VCR head drums", Surf. Coat. Technol., 76–77 (1–3, pt. 2) 1995, (Abstract).

*Primary Examiner*—Roy V. King
*Attorney, Agent, or Firm*—Cooper & Dunham LLP

[57] ABSTRACT

The present invention discloses a method for coating diamond-like carbon on heads and head drums of a video cassette recorder (VCR) by physical vapor deposition-arc method, and VCR heads coated with diamond-like carbon.

8 Claims, 5 Drawing Sheets

5,677,003

METHOD FOR COATING DIAMOND-LIKE CARBON ON HEAD DRUMS OF A VIDEO CASSETTE RECORDER

FIELD OF THE INVENTION

The present invention relates to a method and a device for coating diamond-like carbon on heads and head drums of a video cassette recorder (VCR). More particularly, it relates to a method and a device for coating diamond-like carbon on VCR heads and head drums by physical vapor deposition-arc method.

DESCRIPTION OF PRIOR ART

A magnetic head of a video cassette recorder is made by attaching a substrate to a bass base by epoxy coating, adhering ferrite to its tip with a powerful adhesive agent, and grinding the ferrite. This magnetic head is a core component of a video cassette recorder for recording or reproducing image signals, and its life is nothing but 1,000 hours, approximately.

Various techniques have been proposed to extend the life of the ferrite. As one of them, there is a technique in that diamond-like carbon is coated on the surface of the ferrite to have great resistance to wear.

A head drum of the VCR includes a head for recording image signals on a magnetic tape or reproducing recorded image signals, an upper drum for keeping the head at a predetermined height, and a lower drum supporting the turning of the upper drum and serving as a tape guide.

This head drum driving a video tape at high speed and should be provided with wear-resistance and flatness to stand high speed driving and protect the magnetic tape. In line with the recent development of high deficiency televisions, the demand of head drums having high performance and high function is eventually increased.

A conventional VCR head drum is manufactured through thermal treatment and post processing after forging aluminum. The head drums made in this manner have poor homogeneity to raise inferiority of production, with being under various manufacturing steps.

The VCR head drums are used under the harsh condition of driving a metal tape at high speed, and should have excellent wear-resistance and planar surface. Employing the aluminum as done in a conventional technique considerably degrades durability and wear-resistance, which causes limit to application.

As a solution to this problem, there is proposed a method for forming a diamond-like carbon film on the surface of Al head drum at over 700° C. by chemical vapor deposition. In this method, however, a diamond-like carbon film is formed directly on the surface of aluminum which results in poor cohesive strength according to $Al_2O_3$ film that is formed naturally in the atmosphere.

To enhance the cohesive strength there have been disclosed a technique of depositing SiC on the surface of aluminum and forming a diamond-like carbon film, a technique of employing $CH_4$ gas or $H_2$ gas on the surface of Al head drum, and a technique of using AlN, $B_4C$, $Si_3N_4$, $SiO_2$, etc., which do not make satisfactory results.

A diamond-like carbon film is an amorphous solid phase film, and has hardness, wear-resistance, lubricativeness, electrical insulation, chemical stability and optical characteristics. The synthetic technique of film phase-diamond has been developed nowadays, and its application is expanding expeditiously. Researches into application of this technique to the VCR head and head drum are being made to enhance driving safety, wear-resistance and removal of alien substance therefrom.

The diamond-like carbon film has chemical instability at high temperatures in that the characteristic of the film is changed closely to that of graphite, and the temperature of processing the film is restricted to below 500° C. The cohesive strength of the synthesized film is inferior to restrict its application. Since the synthesized film has high compression stress, a thin film can restrain destroy of film, and a thick film may have a problem of buckling in that the film warps. Especially, the buckling is accelerated with high humidity, and there is restriction to the ambience in which the diamond-like carbon film is used.

Since the VCR head and head drum coated with the diamond-like carbon are manufactured without having solved the problem, they also have inferior adhesiveness and wear-resistance as well as restriction to application. In addition, the facilities for mass production of such heads and head drums have not been prepared yet.

SUMMARY OF THE INVENTION

The present invention is made in an effort to solve the above-mentioned problems. The present invention provides a device for enhancing wear-resistance and flatness of the head surface by forming a cohesive aiding layer and a cohesive-fortifying layer on a ferrite base of a VCR head and the surface of a VCR head drum, and enabling coating of various materials at the same time thereby enormously extending the life of the VCR head and head drum and mass-producing them in a stable condition.

In order to achieve this object, the inventive device comprises:

A device for coating diamond-like carbon on heads and head drums of a video cassette recorder, comprising:
  a vacuum tank including a plurality of cathodes for respectively evaporating Ar, SiO, Ti and diamond-like carbon, and a spindle on its central bottom; and
  upper and lower supporting frames and a plurality of supporting bars being mounted on the spindle of the vacuum tank,
  the lower supporting frame revolving along with the spindle and the supporting bars turning apart from the spindle.

As another aspect of the present invention, a method for coating diamond-like carbon on head drums of a video cassette recorder comprises the steps of:

putting heads inside a vacuum tank and setting vacuum by $1.5 \times 10^{-4}$ to $1.5 \times 10^{-6}$ Torr at 20 to 150° C.;

producing $Ar^+$ ion from an Ar cathode to wash the head surface;

evaporating SiO from an SiO cathode to form an SiO cohesive fortifying layer on the washed head;

evaporating Ti from the Ti cathode to form a Ti cohesive layer on the cohesive fortifying layer; and evaporating diamond-like carbon from a diamond-like carbon cathode to form a thin film on the Ti cohesive layer.

As still another aspect of the present invention, a method for coating diamond-like carbon on head drums of a video cassette recorder, comprises the steps of:

putting head drums inside a vacuum tank and setting vacuum by $1.5 \times 10^{-4}$ to $1.5 \times 10^{-6}$ Torr;

producing $Ar^+$ ion from an Ar cathode to wash the drum surface;

evaporating Ti from a Ti cathode to form a Ti thin film on the washed drum surface;

evaporating SiO from an SiO cathode to form an SiO thin film on the Ti thin film;

evaporating Ti from the Ti cathode to form a Ti thin film on the SiO thin film; and evaporating diamond-like carbon from a diamond-like carbon cathode to form a diamond-like carbon film on the Ti thin film.

DETAILED DESCRIPTION OF THE INVENTION

A device and a method for coating a diamond-like carbon film on head drums of a video cassette recorder (VCR) are now described in detail with reference to the accompanying drawings.

Figure 1:
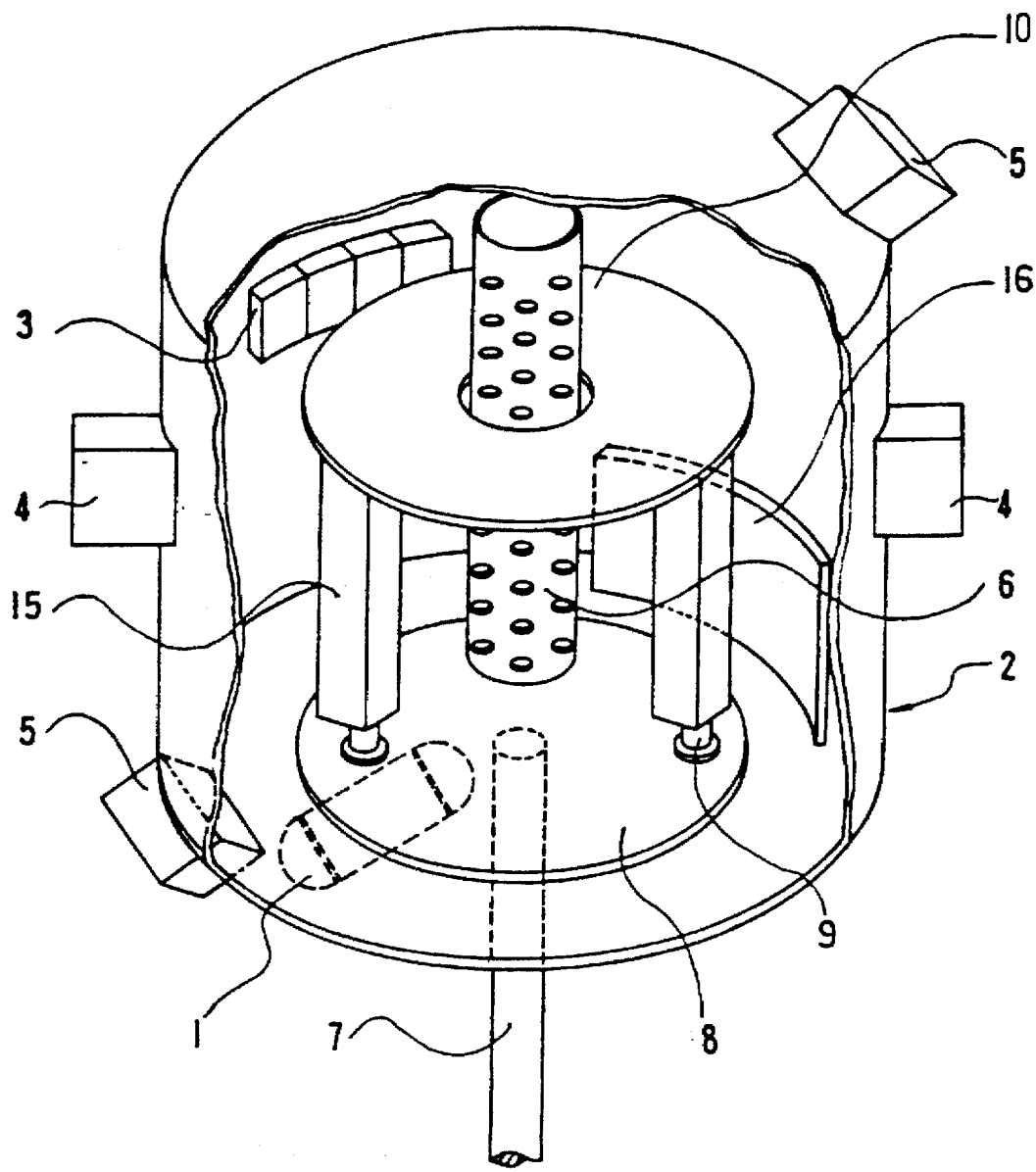
FIG. 1 is a perspective view of a device for coating a diamond-like carbon film on VCR heads and VCR head drums in accordance with the present invention.
Figure 2:
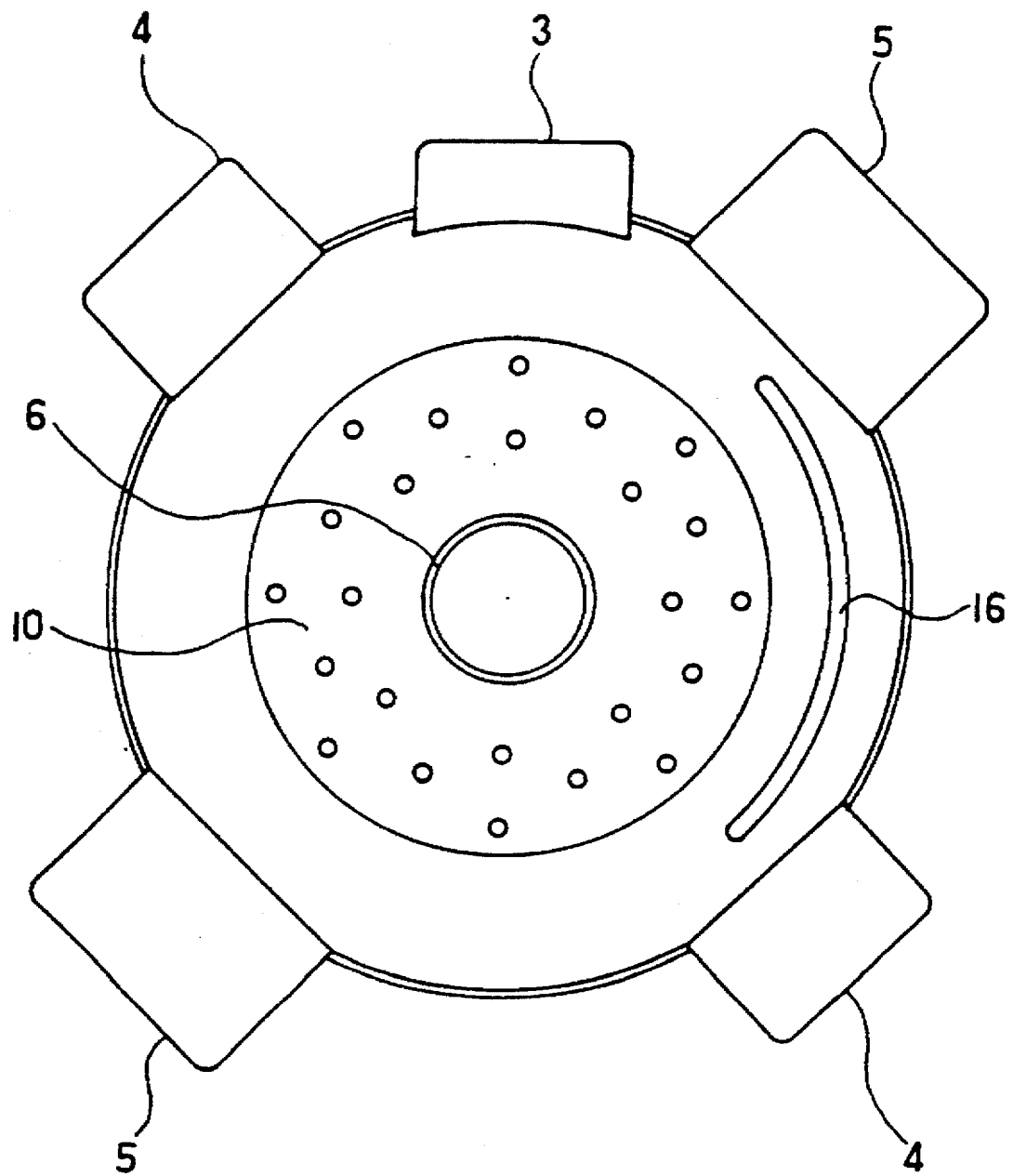
FIG. 2 is a plan view of the device in accordance with the present invention.
Figure 3:
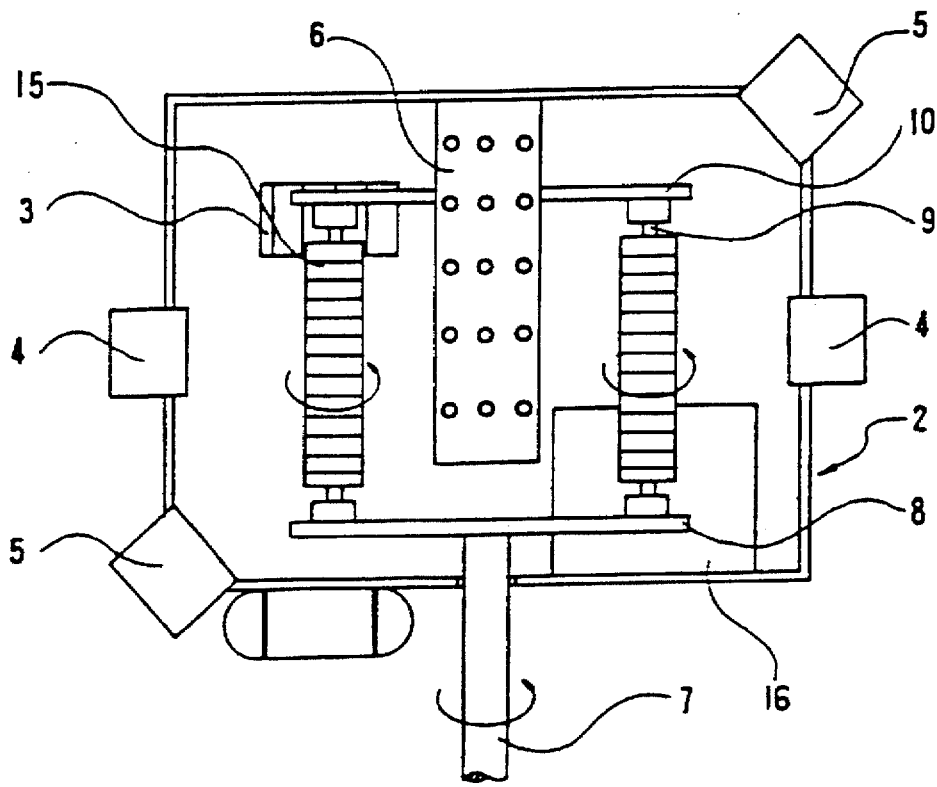
FIG. 3 is a sectional view of the device in accordance with the present invention.
Figure 4:
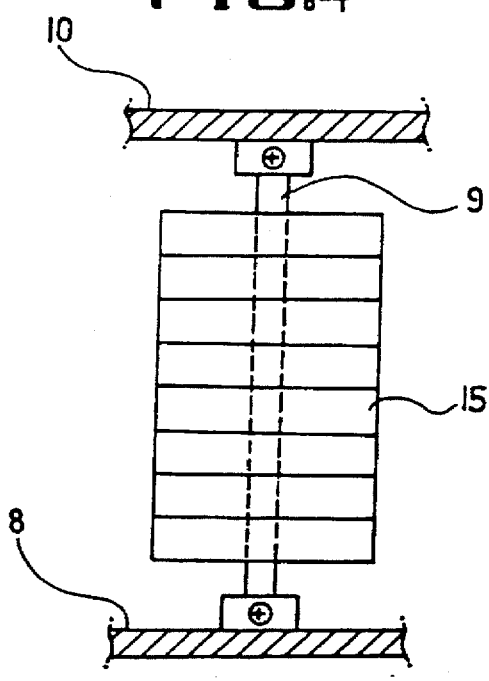
FIG. 4 is a view in use of a supporting bar of VCR head drums in accordance with the present invention.

FIG. 1 and FIG. 2 are respectively a perspective view and a plan view of the inventive device for coating a diamond-like carbon film on VCR heads and VCR head drums. FIG. 3 is a sectional view of the inventive device, and FIG. 4 is a view in use of a supporting bar of VCR head drums in accordance with the present invention.

The inventive device includes a plurality of cathodes 3, 4, and 5 for evaporating argon (Ar), titanium (Ti) and carbon (C) on the inner wall of the vacuum tank 2 that is under vacuum for coating by a vacuum pump 1. Four tackets of the Ar cathode are disposed in a line, and two targets of Ti cathode face each other. Tackets of the C cathode are arranged diagonally upward and downward.

A SiO cathode 6 is disposed downward from the central top of the vacuum tank 2, and connected by Mo tube having a plurality of holes. The position of the above cathodes are alterable according to the shape and material of a plated object. A spindle 7 connected with a spindle motor to be rotatable is coupled with the central bottom of the vacuum tank 2, and a lower supporting frame 8 is linked with the upper part of the spindle 7 by a gear to be rotatable along with the spindle 7. A plurality of supporting bars 9 are disposed on the lower supporting frame 8, and the lower part of the supporting bars 9 are connected to the gear of the upper part of the spindle 7 thereby turning independently regardless the rotation of the spindle 7 and lower supporting frame 8.

An upper supporting frame 10 may be coupled with the upper part of the supporting bars 9 so as to fix the supporting bars 9. The upper supporting frame 10 has a hollow in its center through which the SiO cathode is inserted, and its coupling part is designed to get the supporting bars 9 to turn independently.

The following description is about the working of the inventive device. A plurality of head drums are installed in such a manner of inserting the supporting bars 9 to the holes of the head drums. After installing the head drums, the upper supporting frame 10 is coupled to the upper part to fix the supporting bars 9. By filling Ar, Ti, SiO and C in each cathode and operating the vacuum pump 1, the inside of the vacuum tank 2 is vacuumized. When the spindle 7 turns by operating the spindle motor, the lower supporting frame 8 rotates by turning of the spindle 7. Simultaneously with this, the supporting bars 9 and upper supporting frame 10 connected to the lower supporting frame 8 get to turn.

The upper part of the supporting bars 9 is connected with the gear of the upper part of the spindle 7, and the supporting bars 9 revolve on its axis, apart from the spindle 7.

When heating treatment is performed by applying power to all the cathodes, the evaporated materials form a coating layer on the head drums.

In the single inventive coating device, a plurality of head drums are coated in a short period of time, which facilitates the mass production and ensures simplification of the facilities and reduction of the working hours.

The inventive coating method is carried out in the above-mentioned device, and is described in detail as follows.

VCR head drums are installed in the supporting bars 9, and the supporting bars 9 are fixed by the upper supporting frame 10. Materials are respectively filled in the cathodes 3, 4, 5 and 6, and the vacuum tank is vacuumized by $1.5 \times 10^{-4}$ to $1.5 \times 10^{-6}$.

The upper supporting frame 8 and the supporting bars 9 connected to the upper supporting frame 8 turn upon rotation of the spindle 7 by operating the spindle motor. The supporting bars 9 are connected to the spindle 7 and the gear, and revolve on its axis apart from the rotation of the spindle 7.

Upon applying power to the Ar cathode, the $Ar^+$ ion collides against the surface of the head drums and washes the head drums for ten minutes. After turning off the power of the Ar cathode, coating the head drums for 2 to 40 minutes is carried out by applying power to the Ti cathode, and Ti is deposited on the surface of the head drums to form a Ti layer having a thickness of 500Å to 3 µm.

After turning off the power of the Ti cathode, by applying power to the SiO cathode and heating it for 1 to 30 minutes, a SiO thin film is formed on the Ti thin film to a thickness of 200Å to 2µm. The power of the SiO cathode is turned off upon completing the formation of the SiO thin film.

After having a pause for 1 to 5 minutes, heat is applied to the Ti cathode for 1 to 30 minutes thereby forming a Ti thin film on the SiO thin film to a thickness of 50Å to 3000Å.

The power of the Ti cathode is turned off upon completion of the Ti thin film. After having a pause for 1 to 5 minutes, power is applied to the carbon cathode. By applying heat to the carbon cathode for 10 to 120 minutes a diamond-like carbon (DLC) film is formed on the Ti thin film to a thickness of 50Å to 3µm. The coating process performed under this condition leads to enhancement of the cohesive strength of the DLC thin film by strong chemical bonding and colorfulness of the head drums.

The VCR head drums coated in this manner have a homogeneous coating layer by the angle of the cathodes disposed properly, and have various colors from red to purple according to the thickness of SiO and Ti films.

The coating process of the present invention is described in detail with reference to the following embodiments.

The head drums are put in a vacuum tank to form thin films under the following conditions as shown in Table 1.

As shown in Table 3, sample Nos. 10 and 11 have excellent wear-resistance and lubricativeness, high thermal

TABLE 1

| Sample No. | Vacuum (Torr) | Naturally-formed $Al_2O_3$ | Heating Hours (minutes) | | | | Temperature inside tank | Temperature of material |
|---|---|---|---|---|---|---|---|---|
| | | | Ar | SiO | Ti | DLC | | |
| 1 | $1.5 \times 10^{-4} \sim 1.5 \times 10^{-6}$ | — | — | — | — | 1200Å | 50~150° C. | 15~25° C. |
| 2 | " | — | — | — | — | 100Å | " | " |
| 3 | " | 200Å | 5 min. | 5 min. | 1 min. | 30 min. | " | " |
| 4 | " | 200Å | 7 min. | 7 min. | 2 min. | 40 min. | " | " |
| 5 | " | 200Å | 5 min. | 12 min. | 4 min. | 40 min. | " | " |
| 6 | " | | — | 1 min. | — | 40 min. | " | " |
| 7 | " | | — | 7 min. | — | 120 min. | " | " |
| 8 | " | | 2 min. | 25 min. | 5 min. | 80 min. | " | " |
| 9 | " | | 2 min. | 5 min. | 1 min. | 40 min. | " | " |
| 10 | " | | 15 min. | 30 min. | 5 min. | 90 min. | " | " |
| 11 | " | | 20 min. | 30 min. | 1 min. | 90 min. | " | " |
| 12 | " | | 10 min. | 25 min. | 15 min. | 40 min. | " | " |
| 13 | " | | 15 min. | 25 min. | 10 min. | 80 min. | " | " |
| 14 | " | | 10 min. | 5 min. | 30 min. | 40 min. | " | " |
| 15 | " | | 5 min. | 5 min. | 30 min. | 80 min. | " | " |

The head drums coated under the above conditions undergo the tests of wear-resistance, thermal contraction/expansion, scratching and cohesive strength.

TABLE 2

| Tests | Conditions |
|---|---|
| 1. Wear-resistance | Wear-resistance is tested after scrubbing the head drums for 35 min. by force of 40 g and of 80 g, respectively, with # 20,000 papers. |
| 2. Thermal contaction/expansion | Occurrence of foliation is first checked out at the time of thermal expansion of the films after raising a temperature to 200° C. and second checked out at the time of cooling them off to a normal temperature. |
| 3. Scratch | Occurrence of scratch on the surface of the head drums is checked out after pressing and moving a probe of 0.003 to 0.008 μm by force of 100 g maximum. |
| 4. Cohesive strength | Occurrence of foliation is checked out after a cohesive tape is attached to and then detached from the ferrite base. |

The results of the test according to Table 2 and the colors of the head drums made by the condition of Table 1 are represented in Table 3.

conductivity, removal of dewiness, and high chemical stability. Sample No. 13 has a color of green on yellow ground. Sample Nos. 10 and 11 are excellent in all the aspects, and have various colors of blue, red, green and the like to simply distinguish whether the head drums are coated or not.

In the inventive VCR head cohesive, the cohesive fortifying layer and cohesive aiding layer are formed by SiO and Ti, and the DLC thin film of $C_{12}$ is formed thereon, which enhances cohesiveness and wear-resistance, etc.

In addition, the present invention does not use a reactive gas in order to improve cohesive strength, and the diamond-like carbon coating is performed at below normal temperature. Thus, the coating condition without damage to the Al head drums, is kept up to carry out the stable operation.

Figure 5:
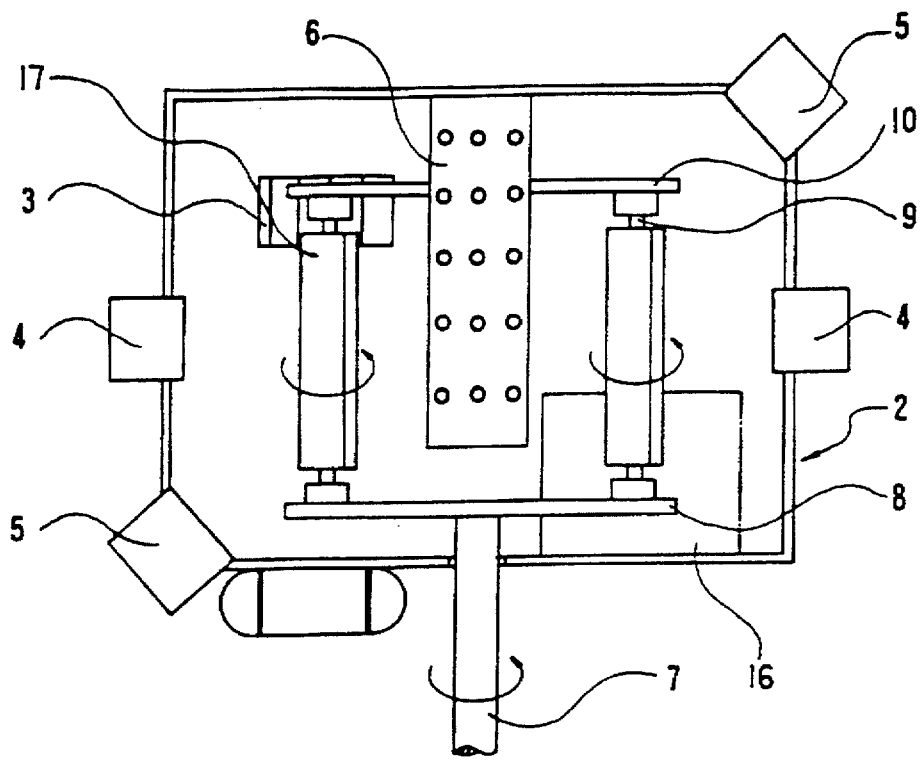
FIG. 5 is a sectional view of a coating device having a head-supporting frame in accordance with the present invention.
Figure 6:
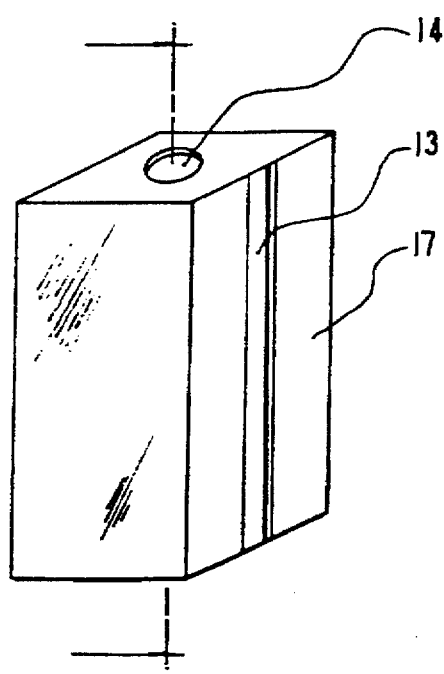
FIG. 6 is a perspective view of the head-supporting frame in accordance with the present invention.
Figure 7:
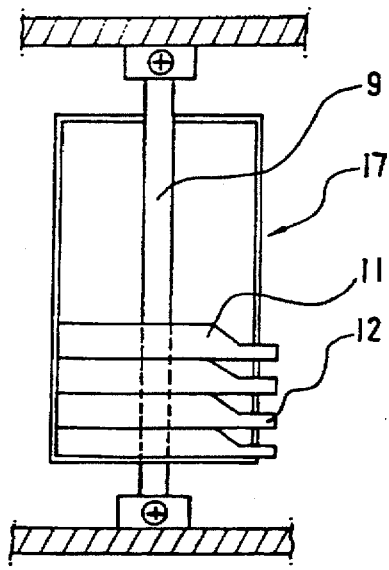
FIG. 7 is a view in use of the head-supporting frame in accordance with the present invention.

Referring now to FIG. 5 and FIGS. 6 and 7, a device and a method for coating the VCR head are described.

The inventive coating device includes rectangular openings 13 formed on its sidewall to protrude the head tips 12, having a plurality of VCR heads 11 to coat them at a time, and the head supporting frame 17 having a hole 14 through which the supporting bar 9 is inserted.

As shown in FIGS. 6 and 7, the head supporting frame 17 of the coating device installs a plurality of heads 11 in such

| Sample No. | Wear-Resistance | Thermal Contraction/Expansion | Dewiness | Scratch | Cohesive Strength | Color |
|---|---|---|---|---|---|---|
| 1 | X | X | X | X | X | Light color |
| 2 | X | X | X | X | X | " |
| 3 | O | O | O | X | O | Red |
| 4 | O | O | O | X | O | Pink |
| 5 | O | O | O | O | X | Deep red |
| 6 | X | X | X | O | X | Light purple |
| 7 | X | X | X | O | X | Purple |
| 8 | O | O | X | O | O | Deep purple |
| 9 | O | O | X | O | O | Deep purple on yellow ground |
| 10 | O | O | O | O | O | Yellow under red layer |
| 11 | O | O | O | O | O | Green on yellow ground |
| 12 | O | O | O | X | O | Green |
| 13 | O | O | O | Δ | O | Green on yellow ground |
| 14 | O | O | O | Δ | X | Deep green |
| 15 | O | Δ | O | O | O | Green on yellow ground | a manner that the head tips 12 are protruded through the rectangular opening 13. The supporting bar 9 is smoothly inserted into the hole 14 of the head supporting frame 17 and through the hole of the body of the head 11. The plurality of the head supporting frames 17 are inserted into the supporting bars 9, and the upper supporting frame 10 is coupled to the upper part of the supporting bars 9 to fix the supporting bars 9.

After filling Ar, Ti, SiO and diamond-like carbon in each cathodes, the inside of the vacuum pump 2 is vacuumized by the operation of the vacuum pump 1.

If the spindle 7 turns by the operation of the spindle motor (not illustrated), the lower supporting frame 8 rotates by the rotation of the spindle 7, and the supporting bars 9 connected to the lower supporting frame and the upper supporting frame 10 revolve, apart from the lower supporting frame 8.

The gear of the lower part of the supporting bars 9 is connected with the gear of the upper part of the spindle 7 in such a manner that the supporting bars 9 revolve on its axis, regardless of the spindle 7.

Upon applying the power and heat to the Ar cathode 3, $Ar^+$ is produced to collide against the rotating head surface thereby washing the head surface.

After the washing, the power of the Ar cathode is turned off, and heat is applied to the SiO cathode 6 to evaporate SiO. The evaporated SiO forms a SiO coating layer on the head surface through the holes of the Mo tube.

Upon completion of SiO coating, the power of the SiO cathode is turned off, and heat is applied to the Ti cathode 4 to evaporate Ti. The evaporated Ti forms a Ti coating layer on the SiO layer formed on the head surface.

After that, the power of the Ti cathode is turned off, and heat is applied to the carbon cathode 5 to evaporate C, which forms a diamond-like carbon (DLC) film on the Ti coating layer formed on the head surface thereby completing the DLC coating process.

Washing and coating effects are improved by disposing the tackets of the Ti cathode to face each other and arranging the four tackets of Ar cathode in a line.

Forming a plurality of holes on the SiO cathode, Mo tube, is to planarize the coating layers on the head surface. The tackets of the carbon cathode are disposed diagonally on the upper and lower parts to maximize the ion-spraying angle and range of the coating layers.

The plurality of the heads are effectively coated for a short period of time in this single coating device of the present invention to facilitate mass production and reduction of the operating hours as well as simplification of the facilities.

The coating method of this invention is now described as follows.

Materials are filled in each cathode 3, 4, 5 and 6, and the inside of the vacuum tank is vacuumized at temperatures 20 to 150° C. by $1.5 \times 10^{-4}$ ~$1.5 \times 10^{-4}$ Torr. When the spindle 7 is turning by operating the spindle motor, the supporting bars 9 connected to the lower and upper support frames revolve on its axis, apart from the rotation of the spindle 7.

By applying heat to the Ar cathode, $Ar^+$ ion collides against the head surface to wash the head surface for 2 to 20 minutes. The power of the Ar cathode is turned off, and power is applied to the SiO cathode to heat it for 5 to 10 minutes. Then, SiO is evaporated through the holes of the Mo tube to form a SiO thin film to a thickness of 50 Å to 5700 Å.

After that, power is applied to the Ti cathode for 20 to 30 minutes to form a Ti thin film on the SiO thin film to a thickness of 50 Å to 500 Å. By applying power and heat to the carbon cathode for 20 to 30 minutes, a diamond-like carbon (DLC) film is formed on the Ti thin film to a thickness of 50 Å to 2 μm. The temperature inside of the tank is kept at 20 to 90° C.

The VCR heads have homogeneous coating layers by the angle of the cathodes disposed properly, and seven colors of blue, light yellow and the like according to the thickness of the SiO layer. The vacuum tank is set by $1.5 \times 10^{-4}$ ~$1.5 \times 10^{-6}$ Torr, and the temperature is set at 20° C. to 90° C. to make clean the coating surface and improve cohesiveness. Using SiO as a coating material and coating the heads to a thickness of 400 Å to 5,700 Å for 5 to 11 minutes ensures the enhancement of the color and cohesiveness.

Using Ti as a coating material can improve cohesive strength and durability. Carbon is also used as a coating material and coated for 20 to 90 minutes to a thickness of 30 Å to 2 μm, which generates $SP^3$ in abundance in this range and strengthen its structure. Sequential coating of SiO, Ti and DLC layers leads to strong chemical bonding for strong cohesiveness.

The inventive coating method is described in detail with reference to the second preferred embodiment.

Preferred embodiment 2

Thin films are formed under the following conditions as shown in Table 4, with putting the heads in a vacuum tank.

TABLE 4

| Sample No. | Vacuum | Ar-Washing | SiO | Ti | DLC | Remarks |
|---|---|---|---|---|---|---|
| 1 | $1.5 \times 10^{-4}$~$1.5 \times 10^{-6}$ | 10 min. | | | 40° C., 30 min 500~700Å | Comparative example |
| 2 | " | " | | | 40° C., 60 min 2000Å | " |
| 3 | " | " | | | 85° C., 30 min 800~1000Å | " |
| 4 | " | " | | | 20° C., 60 min 500~800Å | " |
| 5 | " | " | | | After performing the process as that of sample No. 3 and leaving the resultant as it is for a day, reperforming the process | " |
| 6 | $1.5 \times 10^{-4}$~$1.5 \times 10^{-6}$ | 10 min. | 5 min, 80Å | 20 min, 50Å | 20° C., 30 min. 800Å | present invention |
| 7 | " | " | 8 min, 100Å | 20 min, 50Å | 20° C., 800Å, 30 min. | present invention |

The head drums coated under the above conditions undergo the tests of wear-resistance, thermal contraction/expansion, scratching and cohesive strength according to Table 5.

TABLE 5

| Tests | Conditions |
|---|---|
| 1. Wear-resistance | Wear-resistance is tested after scrubbing the head drums for 35 min. by force of 40 g and of 80 g, respectively, with # 20,000 papers. |
| 2. Thermal contaction/ expansion | Occurrence of foliation is first checked out at the time of thermal expansion of the films after raising a temperature to 200° C. and second checked out at the time of cooling them off to a normal temperature. |
| 3. Scratch | Occurrence of scratch on the surface of the head drums is checked out after pressing and moving a probe of 0.003 to 0.008 μm by force of 100 g maximum. |
| 4. Cohesive strength | Occurrence of foliation is checked out after a cohesive tape is attached to and then detached from the ferrite base. |

The resultants and colors of the head surface obtained by performing process under the condition are represented in Table 6.

TABLE 6

| Sample No. | Wear-Resistance | Thermal Contraction/ Expansion | Scratch | Cohesiveness | Color |
|---|---|---|---|---|---|
| 1 | X | O | O | O | Gray |
| 2 | X | O | X | O | " |
| 3 | O | X | O | O | " |
| 4 | O | X | O | X | " |
| 5 | X | O | O | X | " |
| 6 | O | O | O | O | Blue |
| 7 | O | O | O | O | Light yellow |

Sample Nos. 6 and 7 are excellent in all the aspects, and have a color of blue and light yellow to distinguish if the heads are coated or not.

Figure 8:
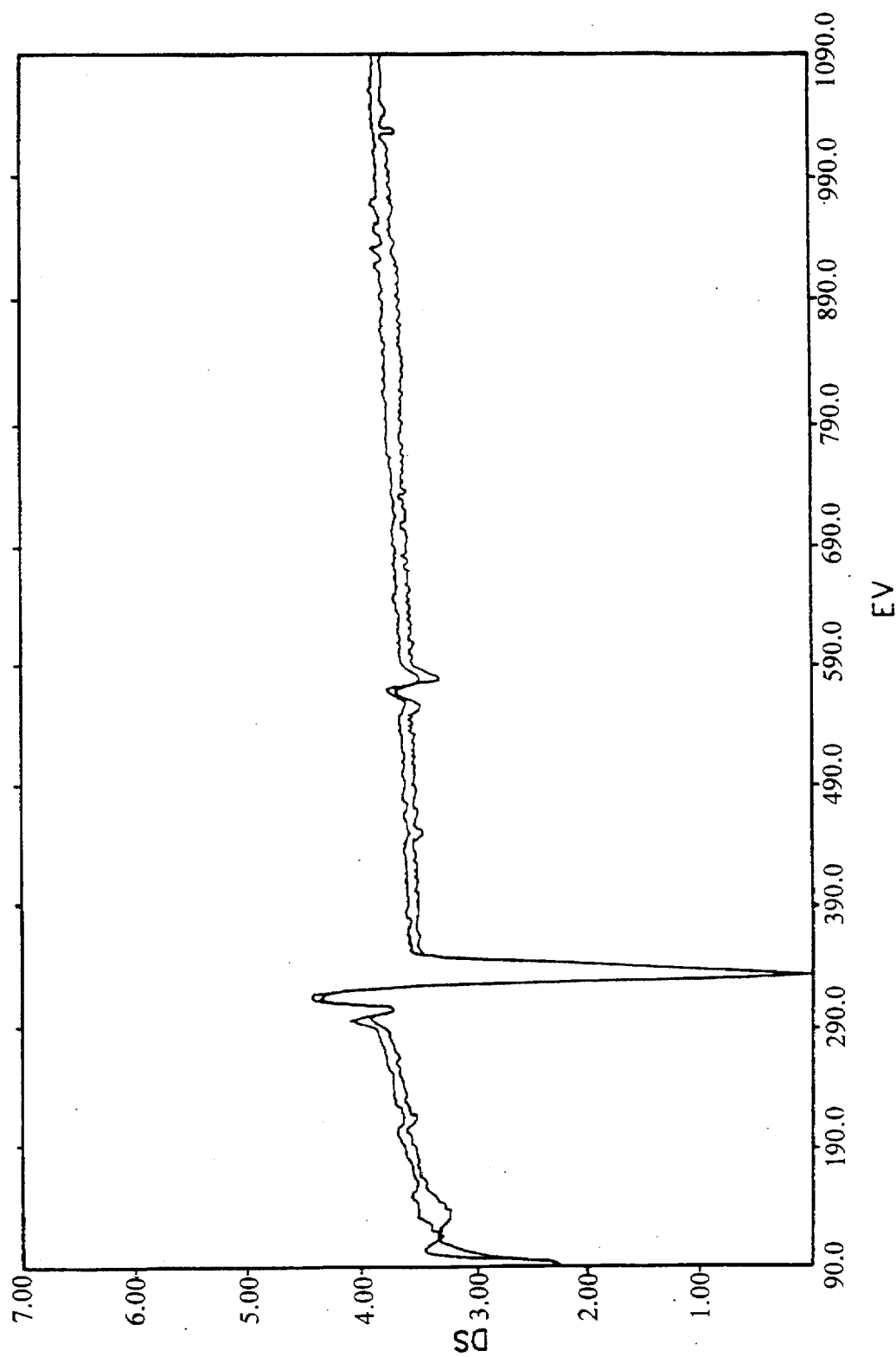
FIG. 8 is a representation of measured values by element analysis of the VCR head surface according to Auser survey.

As shown in FIG. 8 showing a representation of measured values by element analysis of the VCR head surface according to Auser survey, the DLC thin film is satisfactorily adhering to the head surface.

The VCR head includes a cohesive-fortifying layer, a cohesive-aiding layer, and the DLC thin film formed of $C_{12}$ on the thin layers to enhance cohesiveness and wear-resistance, which reduces an air gap between a magnetic tape and VCR head and improves the output of VCR.

In the present invention, a reactive gas is not employed, and DLC coating is performed at below normal temperature thereby carrying out the stable operation without damage to the VCR head.

What is claimed is:

1. A method for coating diamond-like carbon on head drums of a video cassette recorder comprising the steps of:

putting heads inside a vacuum tank and setting vacuum by $1.5 \times 10^{-4}$ Torr;

producing Ar+ ion from an Ar cathode to wash the head surface;

evaporating SiO from an SiO cathode for 5 to 11 minutes to form an SiO cohesive fortifying layer of 4000 Å on the washed head;

evaporating Ti from a Ti cathode to form a Ti cohesive layer on said cohesive fortifying layer; and evaporating diamond-like carbon from grape-shaped C8 or C12 of a diamond-like carbon cathode for 20 to 90 minutes at 20° C. to form a diamond-like carbon thin film of 500 Å to 2 μm on said Ti cohesive layer.

2. A method according to claim 1, further comprising the initial step of washing the heads with ion water and rinsing again them with pure water, drying said heads in a far-infrared ray furnace; and then performing supersonic washing, before putting the heads in the vacuum tank.

3. A method for coating diamond-like carbon on head drums of a video cassette recorder, comprising the steps of:

putting head drums inside a vacuum tank and setting vacuum by $1.5 \times 10^{-4}$ to $1.5 \times 10^{-6}$ Torr;

producing $Ar^+$ ion from an Ar cathode to wash the drum surface;

evaporating Ti from a Ti cathode to form a Ti thin film on the washed drum surface;

evaporating SiO from an SiO cathode to form an SiO thin film on said Ti thin film;

evaporating Ti from the Ti cathode to form a Ti thin film on said SiO thin film; and evaporating diamond-like carbon from a diamond-like carbon cathode to form a diamond-like carbon film on the Ti thin film.

4. A method according to claim 3, wherein there is a pause of 1 to 5 minutes between the third and fourth steps and between the fourth and fifth steps.

5. A method according to claim 3, wherein said Ti thin film of the second step is formed to a thickness of 50Å to 3 μm by evaporating Ti for 2 to 20 minutes.

6. A method according to claim 3, wherein said SiO thin film of the third step is formed to a thickness of 200Å to 2 μm by evaporating SiO for 1 to 30 minutes.

7. A method according to claim 3, wherein said Ti thin film of the fourth step is formed to a thickness of 50 Å to 3 μm by evaporating Ti for 1 to 30 minutes.

8. A method according to claim 3, wherein said diamond-like carbon film is formed to a thickness of 50 Å to 3 μm by evaporating diamond-like carbon for 10 to 120 minutes.

* * * * *